US009006886B2

(12) United States Patent
Bak et al.

(10) Patent No.: US 9,006,886 B2
(45) Date of Patent: Apr. 14, 2015

(54) LIGHT EMITTING DEVICE PACKAGE AND LIGHTING SYSTEM INCLUDING THE SAME

(75) Inventors: Gyu Hyeong Bak, Seoul (KR); Myoung Kyo Kim, Seoul (KR); Tae Uk Ha, Seoul (KR); Kyung Min Je, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 133 days.

(21) Appl. No.: 13/482,147

(22) Filed: May 29, 2012

(65) Prior Publication Data

US 2012/0305976 A1    Dec. 6, 2012

(30) Foreign Application Priority Data

May 30, 2011 (KR) .................. 10-2011-0051563

(51) Int. Cl.
| | | |
|---|---|---|
| H01L 23/48 | (2006.01) | |
| H01L 33/62 | (2010.01) | |
| H01L 33/48 | (2010.01) | |
| H01L 33/64 | (2010.01) | |

(52) U.S. Cl.
CPC .............. *H01L 33/62* (2013.01); *H01L 33/486* (2013.01); *H01L 33/647* (2013.01); *H01L 2224/48091* (2013.01); *H01L 2224/48247* (2013.01)

(58) Field of Classification Search
USPC .................. 257/666–677, 734–737, 98–100
See application file for complete search history.

(56) References Cited

U.S. PATENT DOCUMENTS

| 6,501,103 | B1* | 12/2002 | Jory et al. ..................... 257/100 |
| 7,776,658 | B2* | 8/2010 | Liu et al. ....................... 438/121 |
| 8,030,674 | B2* | 10/2011 | Hsu et al. ....................... 257/98 |
| 8,378,374 | B2* | 2/2013 | Loh et al. ....................... 257/99 |
| 2002/0185649 | A1* | 12/2002 | Oshio ............................. 257/81 |
| 2005/0151231 | A1 | 7/2005 | Yoshida ....................... 257/669 |
| 2006/0097366 | A1* | 5/2006 | Sirinorakul et al. .......... 257/666 |
| 2008/0012036 | A1 | 1/2008 | Loh et al. ....................... 257/99 |
| 2008/0296592 | A1* | 12/2008 | Osamu ........................... 257/89 |
| 2009/0267104 | A1 | 10/2009 | Hsu et al. ....................... 257/99 |
| 2011/0210366 | A1* | 9/2011 | Seo et al. ....................... 257/98 |
| 2012/0074451 | A1* | 3/2012 | Lin ................................ 257/99 |

FOREIGN PATENT DOCUMENTS

| EP | 2 187 459 | 5/2010 |
| KR | 10-0803161 | 2/2008 |
| TW | M400099 | 3/2011 |
| WO | WO 2009/025462 | 2/2009 |

OTHER PUBLICATIONS

European Search Report issued in related Application No. 12170011.6 dated Jan. 7, 2015.

* cited by examiner

*Primary Examiner* — Matthew W Such
*Assistant Examiner* — Ali Naraghi
(74) *Attorney, Agent, or Firm* — Ked & Associates, LLP

(57) ABSTRACT

A light emitting device package is disclosed. The light emitting device package includes a body, first and second lead frames disposed on the body, and a light emitting device connected to the first and second lead frames, wherein at least one of the first and second lead frames includes first and second regions having different thicknesses.

9 Claims, 10 Drawing Sheets

AA - AA" sectional view

AA - AA" sectional view

LIGHT EMITTING DEVICE PACKAGE AND LIGHTING SYSTEM INCLUDING THE SAME

CROSS REFERENCE TO RELATED APPLICATION

This application claims priority under 35 U.S.C. §119 to Korean Patent Application No. 2011-0051563, filed in Korea on May 30, 2011 which are hereby incorporated in its entirety by reference as if fully set forth herein.

TECHNICAL FIELD

Embodiments relate to a light emitting device package and lighting system including the same.

BACKGROUND

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light at high efficiency using fluorescent substances or through color mixing.

Therefore, these light emitting devices are increasingly applied to display devices, transmission modules of optical communication units, light emitting diode backlights as a replacement for cold cathode fluorescent lamps (CCFLs) constituting backlights of liquid crystal display (LCD) devices, lighting apparatuses using white light emitting diodes as a replacement for fluorescent lamps or incandescent lamps, headlights for vehicles and traffic lights.

The light emitting devices are mounted on a package body, thereby forming a light emitting device package. The light emitting device package is configured such that a pair of lead frames is mounted on a package body made of a silicon or PPA (Polyphthalamide) resin, and the light emitting devices are electrically connected to the lead frames.

SUMMARY

In one embodiment, a light emitting device package includes a body, first lead frame and second lead frame disposed on the body, and a light emitting device electrically connected to the first lead frame and second lead frame, respectively, wherein at least one of the first lead frame and second lead frame includes a first region and a second region having different thicknesses.

The thickness of the first region may be greater than that of the second region.

Convex-concave patterns may be disposed at the second region.

The second region may form a closed curve at an edge of the first region.

The second region may be disposed at one side of the first region.

The second region is disposed at each side of the first region.

The second region may have a width of at least 40 μm from an edge of the first lead frame and second lead frame.

A height of an upper surface of the first region may be greater than a height of an upper surface of the second region.

A ratio of a thickness of the first region to a thickness of the second region in at least one of the first lead frame and the second lead frame may be in a range of 4:3 to 3:1.

A shape of the roughness may be at least one of a curved shape, a triangular shape, a rectangular shape and a polygonal shape.

A first protrusion and a first depression may be disposed at facing-away edges of the first lead frame toward the second lead frame, and a second protrusion and a second depression are disposed at facing-away edges of the second lead frame toward the frame lead frame.

The first protrusion may extend from the facing-away edge of the first lead frame toward the second lead frame, and the second protrusion extends from the facing-away edge of the second lead frame toward the first lead frame.

At least one of the first protrusion may be disposed at the first lead frame, and at least one of the second protrusion is disposed at the second lead frame.

The first protrusion may correspond to the second depression.

The second protrusion may correspond to the first depression.

In another embodiment, a light emitting device package includes a body, first lead frame and second lead frame disposed on the body, and a light emitting device electrically connected to the first lead frame and the second lead frames, respectively, wherein at least one of the first lead frame and the second lead frame comprises a peripheral portion on a surface of at least a portion of which roughness are formed.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
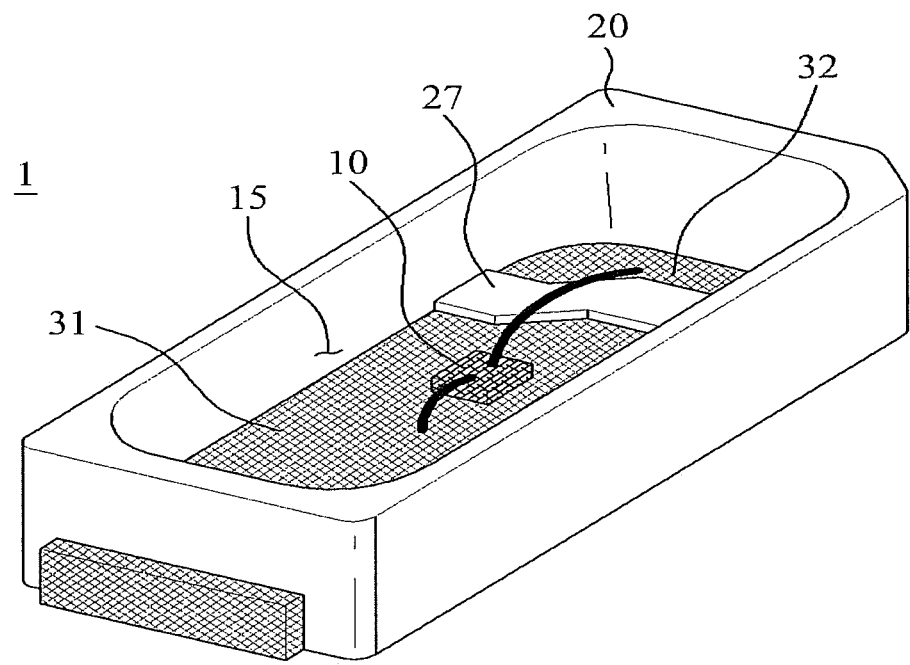
FIG. 1 is a perspective view illustrating a top side of a light emitting device package according to an exemplary embodiment.

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thickness or size of each layer is exaggerated, omitted, or schematically illustrated for convenience of description and clarity. Also, the size or area of each constituent element does not entirely reflect the actual size thereof.

Figure 2:
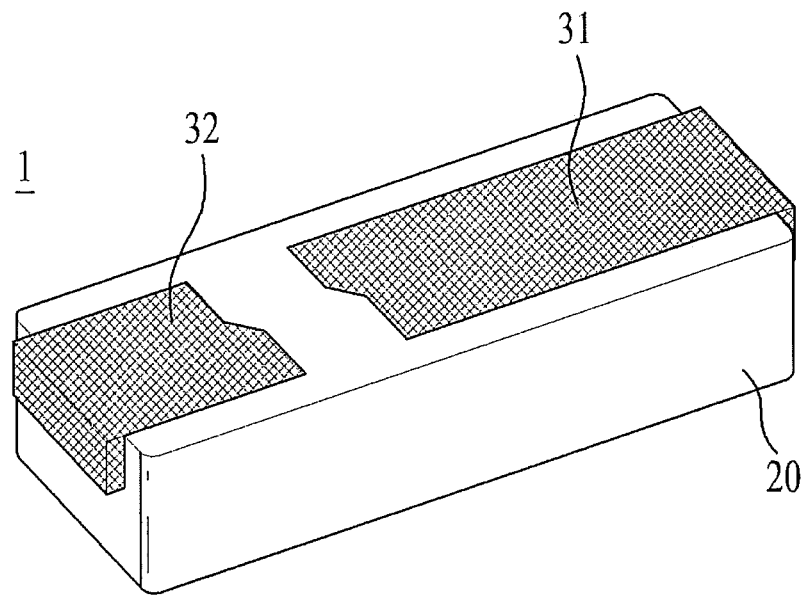
FIG. 2 is a perspective view illustrating a bottom side of the light emitting device package of FIG. 1.
Figure 3:
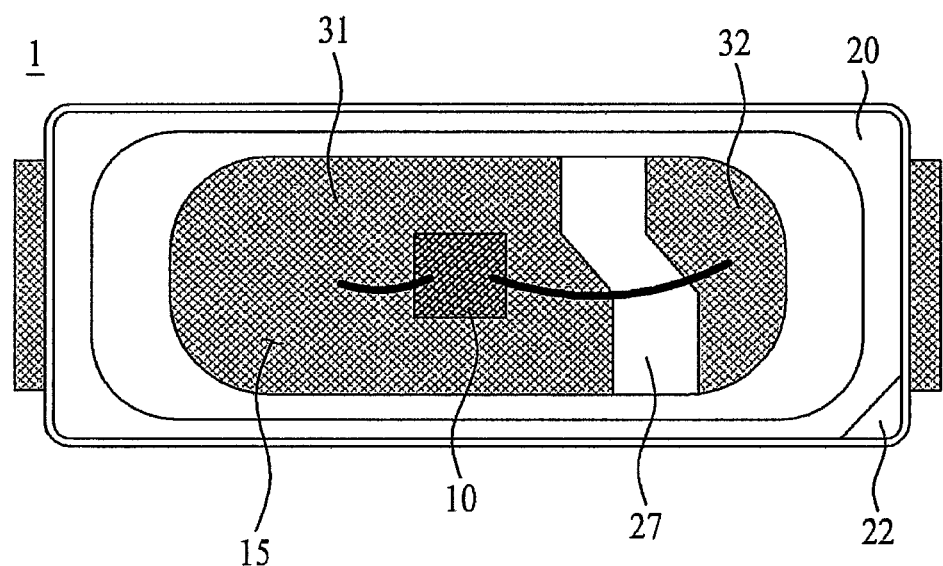
FIG. 3 is a top view of the light emitting device package of FIG. 1.
Figure 4:
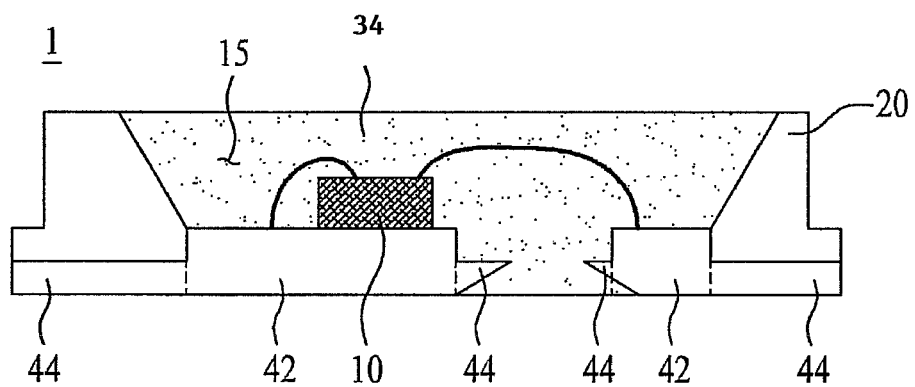
FIG. 4 is a cross-sectional view of the light emitting device package of FIG. 1.

FIG. 1 is a perspective view illustrating a top side of a light emitting device package according to an exemplary embodiment. FIG. 2 is a perspective view illustrating a bottom side of the light emitting device package of FIG. 1. FIG. 3 is a top view of the light emitting device package of FIG. 1. FIG. 4 is a cross-sectional view of the light emitting device package of FIG. 1.

Referring to FIG. 1 to FIG. 4, a light emitting device package 1 according to the illustrated embodiment may include a body 20, a first lead frame 31 and a second lead frame disposed on the body 20, and a light emitting device 10 electrically connected to the first lead frame 31 and the second lead frame 32 to emit light.

The body 20 may be made of at least one material selected from a group consisting of PPA (Polyphthalamide) resin, silicon, metal, PSG (Photo Sensitive Glass) and sapphire ($Al_2O_3$).

The body 20 may be made of a conductive material. In this case, an insulation film (not shown) may be disposed on a surface of the body 20 so as to prevent the body 20 from being connected electrically with the first lead frame 31 and the second lead frame 32.

The top shape of the body 20 may have a triangular shape, rectangular shape, polygonal shape, circular shape or the like depending on application and design of the light emitting device package 1. For example, the light emitting device package 1 disposed in a rectangular top shape as shown in FIG. 4 may be applied to an edge type BLU (backlight unit). When the light emitting device package 1 is applied to a handheld lamp or household lighting apparatus, the body 20 may be adapted to be easily embedded in the handheld lamp or household lighting apparatus in terms of the sized and shape thereof.

A cavity 15 may be formed in the body 20 so as to open a top portion. The cavity 15 may be formed in a shape of a cup, concave vessel, etc. and may have an inner side surface perpendicular to or inclined relative to a bottom of the body 20.

A top view of the cavity 15 may have a circular, rectangular, polygonal or elliptical shape, etc. For example, as shown in FIG. 1 and FIG. 3, the top view of the cavity 15 has a corner-rounded rectangular shape.

A cathode mark 22 may be formed on a top portion of the body 20. The cathode mark 22 may be used to identify a polarity of the first lead frame 31 and the second lead frame 32 of the light emitting device package 1 to ensure correct connection of the first lead frame 31 and the second lead frames 31 and 32.

The first lead frame 31 and the second lead frame 32 are spaced from each other on the body 20 so as to be electrically isolated from each other. The first lead frame 31 and the second lead frame 32 are connected to the light emitting device 10 to supply an electrical power to the light emitting device 10 while being respectively connected to an anode and cathode of an external power supply (not shown).

When the light emitting device 10 is driven by an alternating current, alternating voltages are applied to the first lead frame 31 and the second lead frame 32 which in turn supply the same to the light emitting device 10.

The first lead frame 31 and the second lead frame 32 may be made of a conductive material such as a metal material. For example, the first lead frame 31 and the second lead frame 32 may be made of one material selected from a group consisting of titanium (Ti), copper (Cu), nickel (Ni), gold (Au), chrome (Cr), tantalum (Ta), platinum (Pt), tin (Sn), silver (Ag), phosphorous (P) and an alloy of thereof.

The first lead frame 31 and the second lead frame 32 may be formed to have a single layer structure or a multi-layers structure. When the body 20 is made of a conductive material, the first lead frame 31 and the second lead frame 32 may be partially covered with a non-conductive material (for example, a synthetic resin, PPE, or silicon material, etc.) so as to prevent the first lead frame 31 and the second lead frame 32 from being connected electrically with the body 20.

The first lead frame 31 and the second lead frame 32 may penetrate bottom portions of the body 20 and hence may form bottom portions of the light emitting device package 1. An outer end of each of the first lead frame 31 and the second lead frame 32 protrudes from the body 20.

Since the first lead frame 31 and the second lead frame 32 themselves form bottom portions of the body 20, heat generated from the light emitting device 10 disposed on one of the first lead frame 31 and the second lead frame 32 may be effectively dissipated through the first lead frame 31 or the second lead frame 32.

The light emitting device package 1 may be easily mounted on an external mounting member such as a substrate (not shown) by, for example, soldering the outer end of each of the first lead frame 31 and the second lead frame 32 protruding from the body 20.

Figure 5:
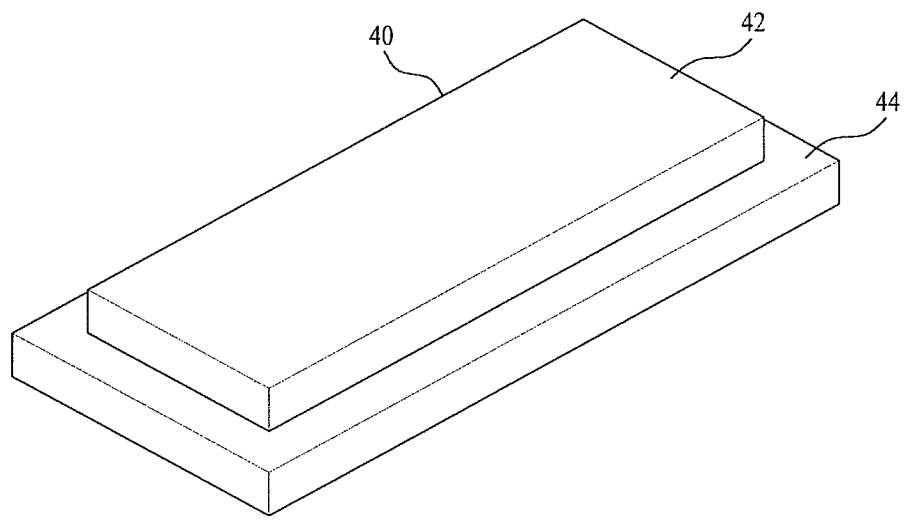
FIG. 5 and FIG. 6 are perspective views illustrating a top side of a first lead frame and a second lead frame of a light emitting device package according to another exemplary embodiment.
Figure 6:
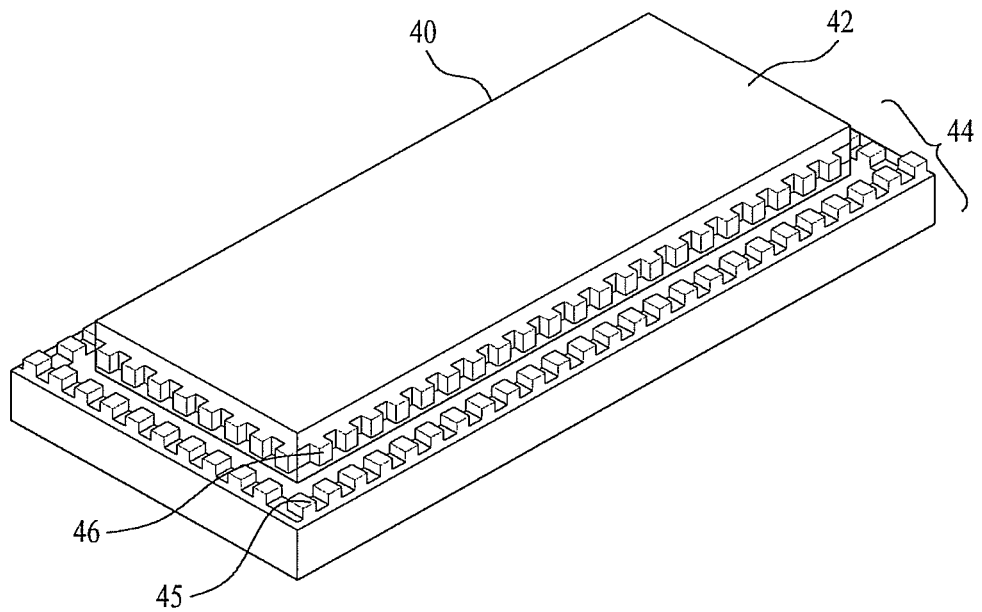
Figure 7:
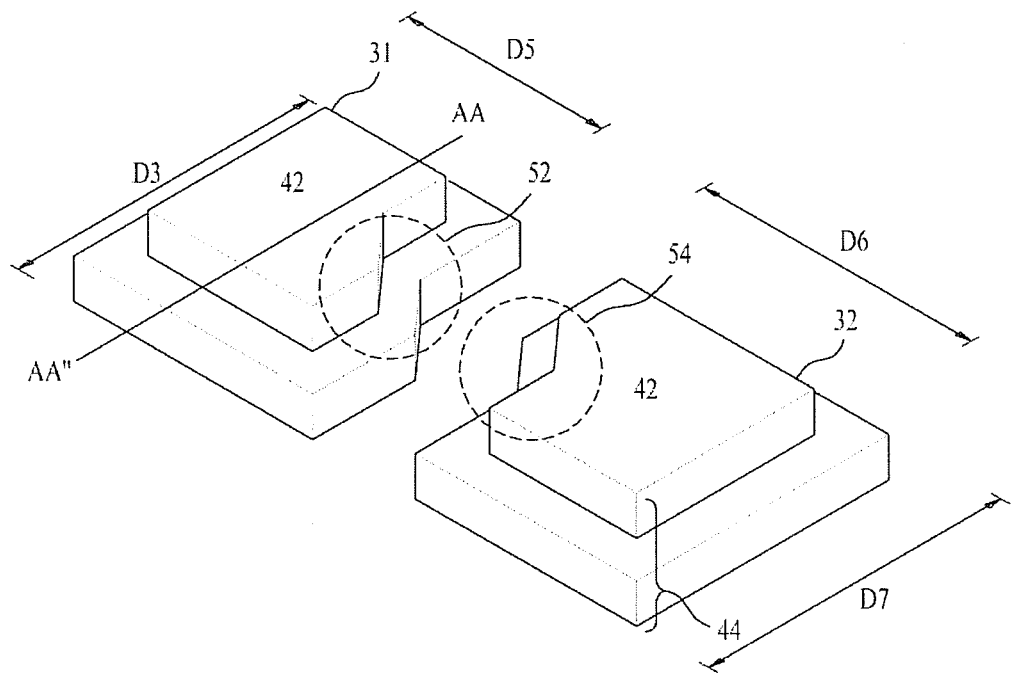
FIG. 7 is a perspective view illustrating a top side of a first lead frame and a second lead frame of a light emitting device package according to still another exemplary embodiment.
Figure 7:
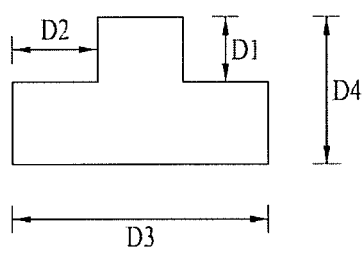

FIG. 5 and FIG. 6 are perspective views illustrating a top side of a first lead frame and a second lead frame of a light emitting device package according to another exemplary embodiment. FIG. 7 is a perspective view illustrating a top side of a first lead frame and a second lead frame of a light emitting device package according to still another exemplary embodiment. The lead frames described with reference to FIG. 5 to FIG. 7 may be the first lead frame 31 and the second lead frame 32 described with reference to FIG. 1 to FIG. 4. Therefore, the following description may be associated with any one of the first lead frame 31 and the second lead frame 32.

When the first lead frame 31 and the second lead frame 32 described with reference to FIG. 1 to FIG. 4 are configured based on exemplary embodiments described with reference to FIG. 5 to FIG. 7, the pair of the lead frames 31 and 32 is arranged on the body 20 such that one-side edges of the lead frames 31 and 32 face away from each other in an aligned manner. A molding material forming the body 20 is filled between the pair of the lead frames 31 and 32 so that the pair of the lead frames 31 and 32 are fixed to the body 20 in a spaced manner.

Referring to FIG. 5 to FIG. 7, a lead frame 40 is formed of a first region 42 and a second region 44. The first region 42 is thicker than the first region 44. That is, the lead frame 40 is formed to have a step resulting from a thickness difference between the first region 42 and the second region 44. For example, a ratio of the thickness of the first region 42 to the thickness of the second region 44 may be in a range of 4:3 to 3:1. The second region 44 forms a closed curve at a peripheral region of the first region 42. Consequently, the first region 42 may correspond to a central portion, and the second region 44 may correspond to a peripheral portion.

The molding material forming the body 20 is filled in a step region between the first region 42 and the second region 44. Once the molding material has been cured, the lead frame 40 is supported by the body 20.

The second region 44 may include a horizontal portion and vertical portion 46. The horizontal portion 45 is parallel to a horizontal plane of the lead frame 40 and the vertical portion 46 has a height equal to a height of the step and is perpendicular to the horizontal plane of the lead frame 40.

Surfaces of the horizontal portion 45 and vertical portion 46 of the second region 44 have roughness. In FIG. 6, each of the roughness has a rectangular shape. The present disclosure is not limited thereto. For example, the roughness may have a curved shape, a triangular shape or another polygonal shape, any combinations thereof, or the like. In order to increase coupling strength between the body 20 and the lead frame 40, the roughness preferably has a width above 40 µm. Since the molding material forming the body 20 is inserted into the roughness and then is cured, the lead frame 40 may be securely coupled to the body 20. Thus, the first lead frame 31 and the second lead frame 32 disposed in the same manner as the lead frame 40 as mentioned above may be securely coupled to the body 20.

In this embodiment, the lead frame 40 is formed to have a step between the first region 42 and the second region 44 and the surface of the peripheral portion 44 is formed to have the roughness. In this way, the lead frame 40 is more securely coupled to and supported by the molding material forming the body 20.

Referring to FIG. 7, a first protrusion 52 and a second protrusion 54 are disposed at facing-away edges of the pair of the first lead frame 31 and second lead frame respectively. The first protrusion 52 and the second protrusion 54 are disposed not to face away from each other. That is, the first protrusion 52 and the second protrusion 54 do not correspond to each other. The facing-away edges of the pair of the first lead frame 31 and the second lead frame are spaced from each other and are bended in a parallel manner to each other.

At the facing-away edges of the pair of the first lead frame 31 and the second lead frame, other regions than the first protrusion 52 and the second protrusion 54 formation regions have respective depressions relative to the first protrusion 52 and the second protrusion 54.

The first protrusion 52 and the second protrusion 54 do not correspond to each other and, instead, correspond to the depressions of the second lead frame 32 and the first lead frame 31 respectively. That is, the first protrusion 52 and the second protrusion 54 face away from the depressions of the second lead frame 32 and the first lead frame 31 respectively.

In this embodiment, the first protrusion 52 includes a single protrusion and the second protrusion 54 includes a single protrusion. The present disclosure is not limited thereto. The first protrusion 52 may include a plurality of protrusions and the second protrusion 54 may include a plurality of protrusions.

Since the first protrusion 52 and the second protrusion 54 are disposed at the facing-away edges of the pair of the first and second lead frames 31 and 32 respectively, surface areas of the facing-away edges of the pair of the first and second lead frames 31 and 32 may be increased. Accordingly, contact areas between the frames 31 and 32 and the molding material may be increased.

As the contact areas between the frames 31 and 32 and the molding material are increased, friction between the frames 31 and 32 and the molding material is increased. In this way, the first and second lead frames 31 and 32 may be more securely coupled and fixed to the molding material when manufacturing the light emitting device package 1.

In accordance with this embodiment, the lead frame 40 may advantageously have a very simple structure to be securely coupled to the body 20 and hence such structural simplicity contributes to reliability and stability of a resultant light emitting device package.

The light emitting device 10 may be mounted on one of the first and second lead frames 31 and 32 which may supply an external electrical power to the light emitting device 10. When the light emitting device 10 receives the electrical power, the light emitting device emits light.

Heat generated from the light emitting device 10 may be transferred to the first or second lead frames 31 or 32 which in turn may effectively discharge the heat.

The light emitting device 10 may include at least one light emitting diode (LED). The light emitting diode may be a color light emitting diode emitting red, green, blue, white light, etc. or may be a UV light emitting diode emitting ultra violet light. The present disclosure is not limited thereto.

The light emitting device 10, as shown in the figures, may be electrically connected to the first and second lead frames 31 and 32 in a wire bonding manner. Alternatively, the light emitting device 10 may be electrically connected to the first and second lead frames 31 and 32 in a flip chip or die boding manner.

As shown in FIG. 3, a sealing material 34 may be filled in the cavity 20 of the body 15 in order to seal and protect the light emitting device 10. The sealing material 34 may isolate the inside of the cavity 15 from the outside, and may further contain a fluorescent substance to change characteristics of light emitted from the light emitting device 10.

The sealing material 34 may include a silicon or resin material. As a method of forming the sealing material 34 in the cavity 15, the silicon or resin material is filled in the cavity 15 and then is cured. The present disclosure is not limited thereto.

The sealing material 34 may further contain the fluorescent substance so that light emitted from the light emitting device 10 is excited by the fluorescent substance to render a different color. For example, when the light emitting device 10 is a blue light emitting diode and the fluorescent substance is a yellow fluorescent substance, blue light from the blue light emitting diode is excited by the yellow fluorescent substance to change into white light. When the light emitting device 10 emits ultra violet light and red, green and blue fluorescent substances are added to the sealing material 40, white light is rendered from the light emitting device package.

In addition, on the sealing material 34, lenses (now shown) may be disposed to adjust distribution of light emitted from the light emitting device package 1. Moreover, in the body 20 of the light emitting device package 1, a Zener diode may be disposed to improve withstand voltage characteristic.

When the Zener diode (not shown) is included in the light emitting device package 1, the light emitting device 10 is mounted on one of the first and second lead frames 31 and 32 while the Zener diode is mounted on the other of the first and second lead frames 31 and 32, so that there may not occur interference between the light emitting device 10 and Zener diode.

One example of the size of the light emitting device package 1 will be set forth with reference to FIG. 7. A cross-section taken at a width-direction line AA-AA" of the first and second lead frames 31 and 32 buried in the body 20 of the light emitting device package 1 has a '⊥' shape. The '⊥' shape has the following dimensions.

Reference numeral D1 indicates a vertical length of the first region 42 of the first lead frame 31 and the second lead frame 32 and may be in a range of 1.0 mm to 1.5 mm.

Reference numeral D2 indicates a width of the second region 44 of the first lead frame 31 and the second lead frame 32 and may be in a range of 40 µm to 1.0 mm or 1.5 mm.

Reference numerals D3 and D7 indicate widths of the first lead frame 31 and the second lead frame 32 respectively and may be in a range of 1.7 mm to 1.8 mm.

Reference numeral D4 indicates a thickness of the first lead frame 31 and the second lead frame 32 and may be in a range of 2 mm to 3 mm.

Reference numerals D5 and D6 indicate lengths of the first lead frame 31 and the second lead frame 32 respectively and may be in a range of 2.6 mm to 2.7 mm.

The numbers described above with regard to D1 to D7 are merely one example specified for the '⊥' shape. The present disclosure is not limited thereto. The dimensions of the '⊥' shape may vary depending on applications or models of the light emitting device package or may be changed to improve manufacturing ease and/or reliability of the light emitting device package.

When the length of the first lead frame 31 is larger than that of the second lead frame 32, the light emitting device 10 is preferably mounted on the first lead frame 31 to secure a larger heat discharge area. In this case, the Zener diode (not shown) to stabilize a voltage of an external power supply when the external power is applied through the first and second lead frames 31 and 32 to the light emitting device 10 is preferably mounted on the second lead frame 32. The present disclosure is not limited thereto.

FIG. 8 to FIG. 11 are perspective views illustrating light emitting device packages according to other exemplary embodiments.

Figure 8:
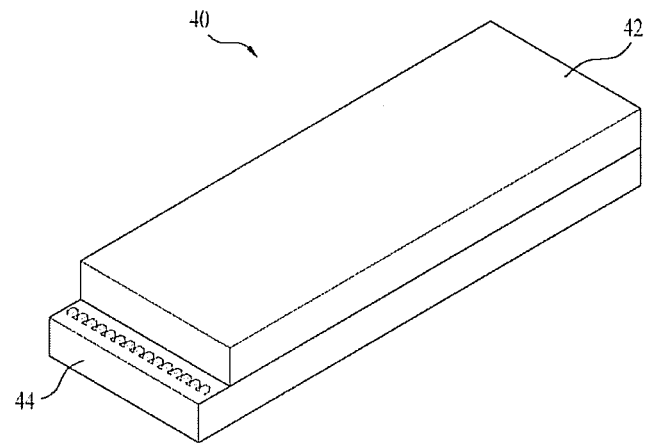
FIG. 8 to FIG. 11 are perspective views illustrating light emitting device packages according to other exemplary embodiments.

First, a lead frame 40 according to an embodiment shown in FIG. 8 includes a first region 42 and a second region 44. The first region 42 is thicker than the second region 44. Unlike the previous embodiment, the second region 44 is disposed at one side of the first region 42.

A convex-concave pattern is formed at the surface of the second region 44 of the lead frame 40. The convex-concave pattern has a rectangular shape in the drawing. Alternatively, the convex-concave pattern may have at least one selected from a group consisting of a curved shape, a triangular shape, a rectangular shape and a polygonal shape. In order to increase coupling strength between a body and the second region 44 of the lead frame 40, the convex-concave pattern may have a width above 40 µm from the edge of the frame 40.

Figure 9:
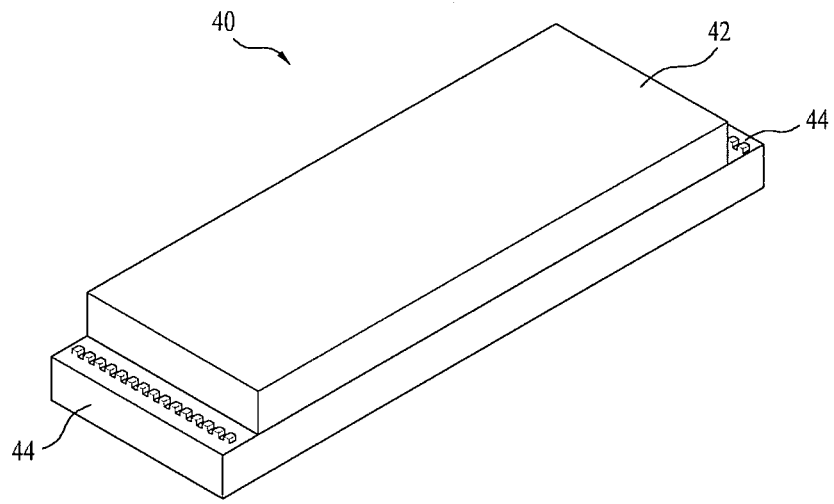

A lead frame 40 according to an embodiment shown in FIG. 9 includes a first region 42 and second regions 44 disposed at opposite sides of the first region 42. The first region 42 is thicker than the second regions 44. The above-mentioned convex-concave pattern is formed at the surface of each of the second regions 44.

Figure 10:
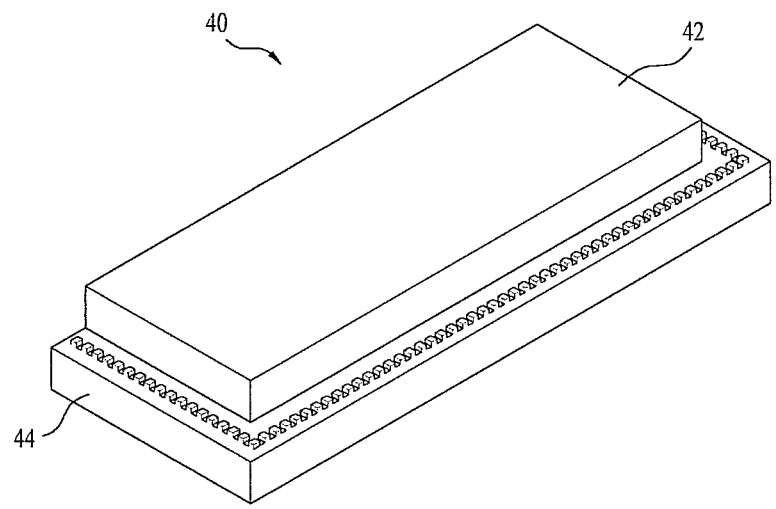

A lead frame 40 according to an embodiment shown in FIG. 10 includes a first region 42 and second regions 44 disposed at three sides of the first region 42. The first region is thicker than the second regions 44. The above-mentioned convex-concave pattern is formed at the surface of each of the second regions 44.

Figure 11:
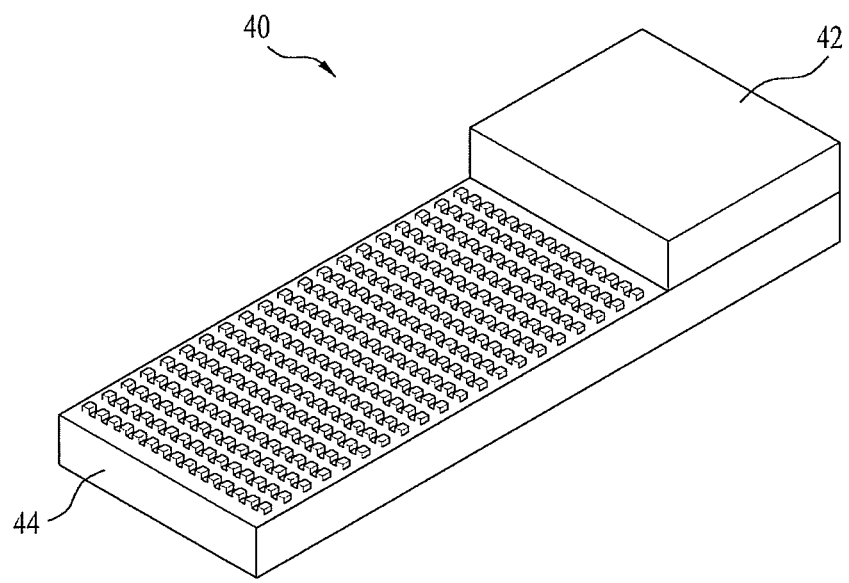

A lead frame 40 according to an embodiment shown in FIG. 11 is similar to that shown in FIG. 8 except that the second region 44 has a width greater than a width W1 of the first region 42. In the structure of the lead frame 40 according to this embodiment, the area of the second region 44, at which a convex-concave pattern is formed, is increased to increase coupling strength between a body and the second region 44.

Figure 12:
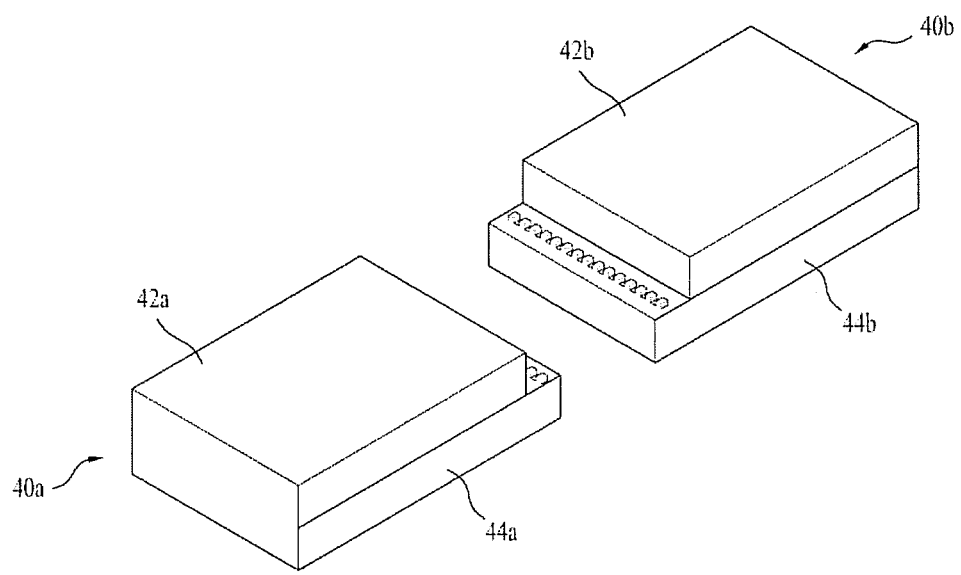
FIG. 12 to FIG. 14 are views illustrating the disposition of lead frames shown in FIG. 8.
Figure 13:
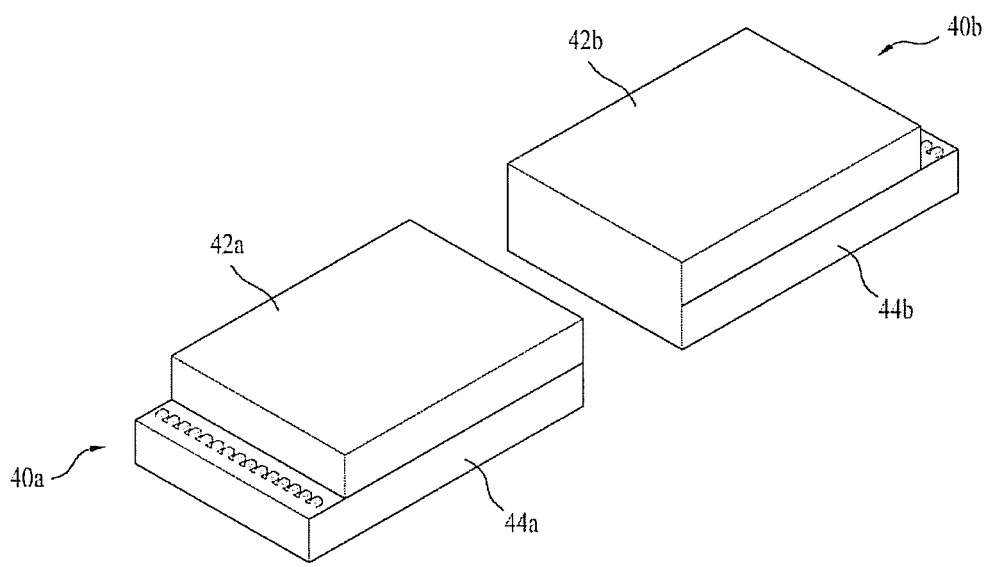
Figure 14:
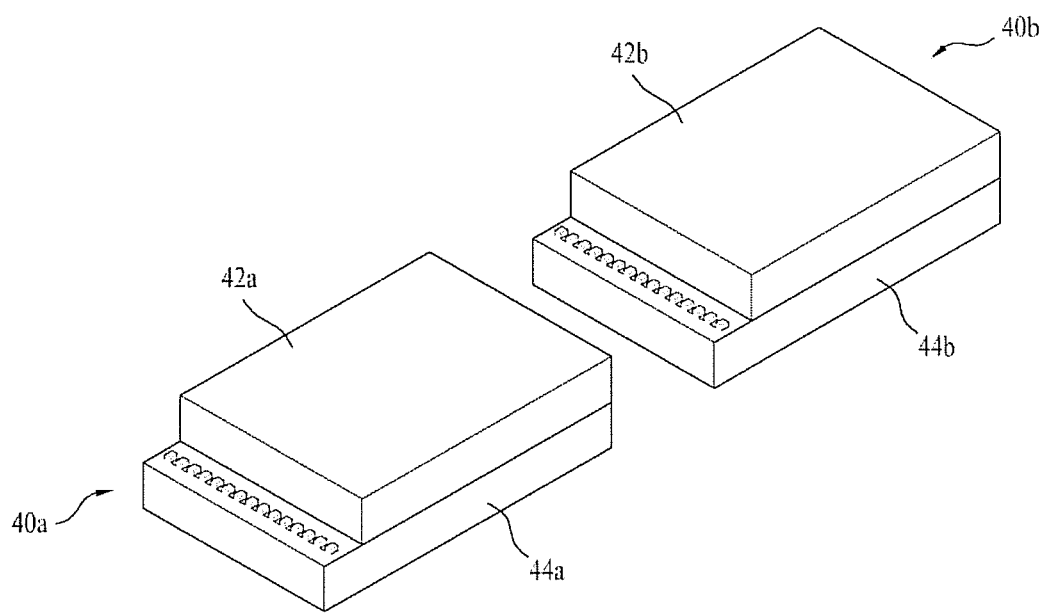

FIG. 12 to FIG. 14 are views illustrating the disposition of the lead frames shown in FIG. 8, particularly the lead frames in the light emitting device package including a pair of lead frames shown in FIG. 8.

In an embodiment shown in FIG. 12, a first lead frame 40a includes a first region 42a and a second region 44a, and a second lead frame 40b includes a first region 42b and a second region 44b. The second region 44a of the first lead frame 40a faces the second region 44b of the second lead frame 40b.

In an embodiment shown in FIG. 13, a first region 42a of a first lead frame 40a faces a first region 42b of a second lead frame 40b, and a second region 44a of the first lead frame 40a and a second region 44b of the second lead frame 40b face the outside of the light emitting device package.

The above disposition of the lead frames may increase coupling strength between the body and a portion of each of the lead frames at the center or the outside of the light emitting device package.

In accordance with the light emitting device package according to the present disclosure, the coupling between the lead frames and the body may be more rigid with a minimal structure alteration of the lead frames. Such a coupling rigidity may improve reliability of the package.

An array of the light emitting device packages of the embodiment may be on a substrate, and a light guide plate, a prism sheet, a diffusion sheet, and the like that are optical members may be disposed on a light path of the light emitting device package. The light emitting device package, the substrate, and the optical members may function as a lighting unit. As another embodiment, a display device, an indicating device, or a lighting system may be produced, which includes the semiconductor light emitting device or the light emitting device package described in the foregoing embodiments, and the lighting system may include, for an example, a lamp or a street light.

A lighting device and a backlight unit will be described as one embodiment of the light system having the foregoing light emitting device package disposed thereto will be described.

Figure 15:
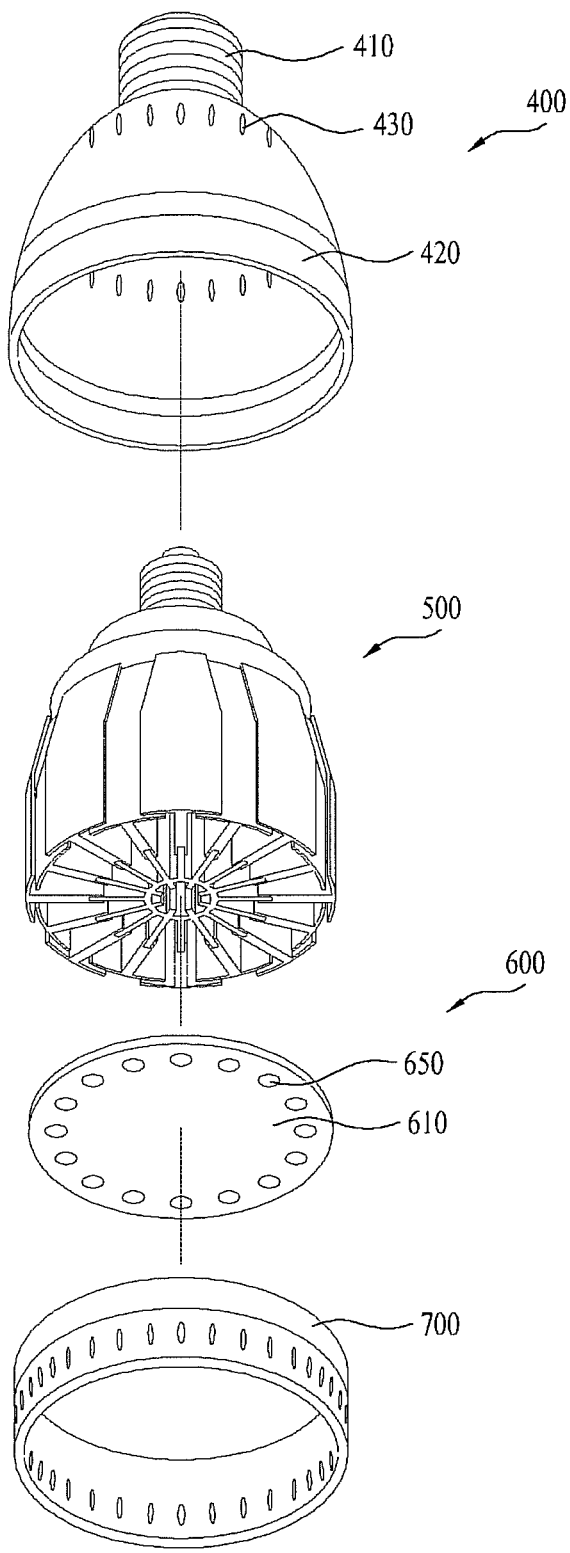
FIG. 15 illustrates an exploded perspective view of a lighting device in accordance with one embodiment, having one of the light emitting device packages applied thereto.

FIG. 15 illustrates an exploded perspective view of a lighting device having a light emitting device package in accordance with an embodiment of the present invention applied thereto.

Referring to FIG. 15, the lighting device includes a light source 600 for projecting a light, a housing 400 for housing the light source 600, a heat dissipating unit 500 for dissipating heat from the light source 600, and a holder 700 for fastening the light source 600 and the heat dissipating unit 500 to the housing 400.

The housing 400 includes a socket fastening portion 410 for fastening the housing 400 to an electric socket (Not shown) and a body portion 420 connected to the socket fastening portion for housing the light source 600. The body portion 420 may have an air flow opening 430 passing therethrough.

The body portion 420 of the housing 400 has a plurality of air flow openings 430. The air flow opening 430 may be singular or plural disposed, but not limited to, radially as shown in the drawing.

The light source 600 has a plurality of the light emitting device packages 650 provided on a circuit board 610.

And, the holder 700 is provided under the light source, including a frame and another air flow openings. Though not shown, an optical member may be provided to under the light source 600 for causing the light from the light emitting device package 650 of the light source 600 to diverge, scatter, or converge.

Figure 16:
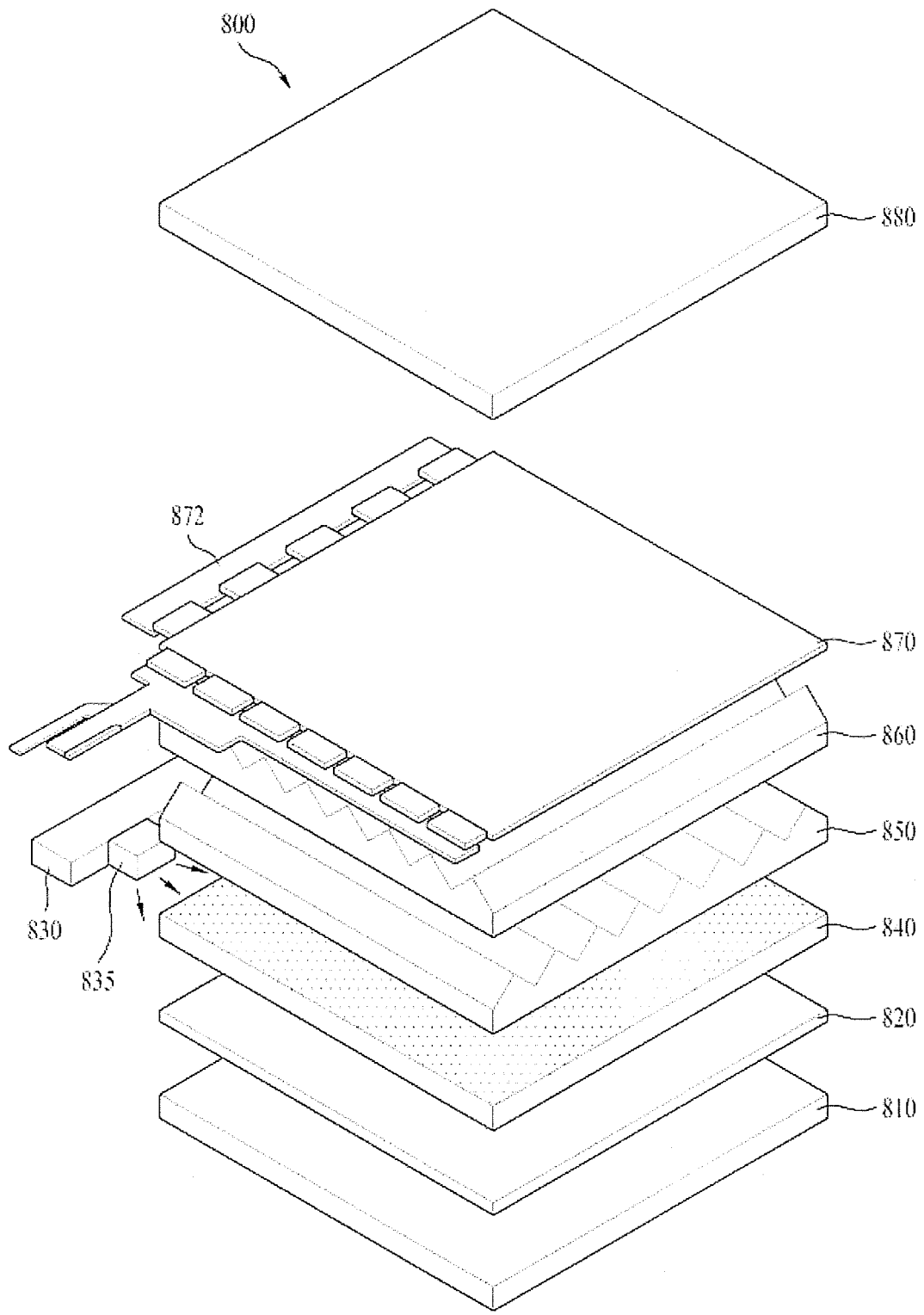
FIG. 16 illustrates a perspective view of an image display device in accordance with one embodiment, having the foregoing light emitting device package applied thereto.

FIG. 16 illustrates an exploded perspective view of an image display device in accordance with one embodiment, having the foregoing light emitting device package applied thereto.

Referring to FIG. 16, the image display device 800 includes a bottom cover 810, a reflective plate 820 on the bottom cover 810, a light source module 830/835 for emitting a light, a light guide plate 840 disposed in front of the reflective plate 820 for guiding the light from the light source module 830 and 835 to a front of the image display device 800, optical sheets including prism sheets 850 and 860 disposed in front of the light guide plate 840, a display panel 870 disposed in front of the optical sheets, a picture signal forwarding circuit 872 connected to the display panel 870 for supplying a picture signal to the display panel 870, and a color filter 880 disposed in front of the display panel 870. In this instance, the bottom cover 810, the reflective plate 820, the light source module 830 and 835, the light guide plate 840, and the optical sheets may construe a backlight unit.

The light source module includes a light emitting device package 835 on a substrate 830. In this instance, the substrate 830 may be a PCB or the like.

The bottom cover 810 may accommodate elements of the image display device 800. And, the reflective plate 820 may be an individual element as shown in the drawing, or may be a coat of a material with a high reflectivity on a rear of the light guide plate 840 or on a front of the bottom cover 810.

In this instance, the reflective plate 820 may be formed of a material which has high reflectivity and can form a micron-film, such as PET (PolyEthylene Terephtalate).

And, the light guide plate 840 scatters the light from the light source module 830/835 for uniform distribution of the light to an entire region of a screen of the liquid crystal display panel 870. Accordingly, the light guide plate 830 is formed of a material having good refractivity and transmissivity, such as PolyMethylMethAcrylate PMMA, PolyCarbonate PC, PolyEthylene PE, or injection molded resin. And, the light guide plate 840 may be omitted to take an air guide system in which the light transmits through air over the reflective plate 820.

And, the first prism sheet 850 may be formed of a polymer having light transmissivity and elasticity on one side of a supporting film. The polymer may have a prism layer with a plurality of three dimensional structures disposed thereon, repeatedly. In this instance, as shown, the plurality of patterns may be a stripe type with repetitive ridges and grooves.

And, a direction of the ridges and the grooves in the second prism sheet 860 may be perpendicular to a direction of the ridges and the grooves in the first prism sheet 850, for uniform distribution of the light from the light source module and the reflective sheet to an entire surface of the display panel 870.

And, though not shown, each of the prism sheets may have a protective sheet provided thereon by providing a protective layer having light diffusing particles and a binder on both sides of the supporting film. And, the prism layer may be formed of a polymer material selected from a group including polyurethane, styrene butadiene copolymer, polyacrylate, polymethacrylate, polymethylmethacrylate, polyethyleneterephthalate elastomer, polyisoprene, and polysilicone.

And, though not shown, a diffusion sheet may be disposed between the light guide plate 840 and the first prism sheet 850. The diffusion sheet may be formed of a material selected from a polyester group and a polycarbonate group, for widening a light projection angle to the maximum by refraction and scattering of the light from the backlight unit. And, the diffusion sheet may include a supporting layer having light diffuser contained therein, and a first layer and a second layer both without the light diffuser contained therein disposed on a light forwarding surface (a first prism sheet direction) and a light incident surface (a reflective sheet direction), respectively.

In the embodiment, the diffusion sheet, the first prism sheet 850 and the second prism sheet 860 construe the optical sheet. The optical sheet may be constructed of other combination, for an example, a microlens array, a combination of the diffusion sheet and the microlens array, a combination of one prism sheet and the microlens array, or so on.

As the display panel 870, a liquid crystal panel may be applied, and besides the liquid crystal panel, other kind of image display device which requires a light source may be applied. The display panel 870 has liquid crystals disposed between glass panels, and a polarizing plate placed on both of the glass panels for utilizing polarizability of a light. The liquid crystals have intermediate characteristics of liquid and solid, in which the liquid crystals, organic molecules with fluidity like the liquid, are disposed regularly like crystal. By utilizing a property of the liquid crystals in which a molecular arrangement varies with an external electric field, a picture is displayed.

The liquid crystal panel used in the image display device has an active matrix system, in which a transistor is used as a switch for controlling a voltage supplied to pixels. And, the liquid crystal panel 870 has a color filter 880 on a front for each of pixels to transmit only red, green and blue lights of the light from the panel 870, thereby displaying a picture.

Although, embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a body;
   a first lead frame and a second lead frame coupled to the body;
   a light emitting device electrically connected to the first lead frame and the second lead frame,
      wherein at least one of the first lead frame or second lead frame includes a first region and a second region, and wherein a thickness of the first region, from a top surface of the at least one of the first or second lead frame in the first region to a bottom surface of the first region, is different than a thickness of the second region of the at least one of the first or second lead frame, from a top surface of the second region to a bottom surface of the second region; and
   a first protrusion and a first depression formed in an edge of the first lead frame facing the second lead frame, and a second protrusion and a second depression formed in an edge of the second lead frame facing the first lead frame.

2. The light emitting device package of claim 1, wherein the first protrusion extends from the edge of the first lead frame toward the second lead frame, and the second protrusion extends from the edge of the second lead frame toward the first lead frame.

3. The light emitting device package of claim 1, wherein the first protrusion comprises one first protrusion formed in an edge of the first region of the first lead frame and another first protrusion formed in an edge of the second region of the first lead frame, and the second protrusion comprises one second protrusion formed in an edge of the first region of the second lead frame and another second protrusion formed in an edge of the second region of the second lead frame.

4. The light emitting device package of claim 1, wherein a position of the first protrusion corresponds to a position of the second depression.

5. The light emitting device package of claim 1, wherein a position of the second protrusion corresponds to a position of the first depression.

6. A light emitting device package, comprising:
a body;
a first lead frame and a second lead frame disposed on the body; and
a light emitting device electrically connected to the first lead frame and the second lead frame,
wherein at least one of the first lead frame or the second lead frame has a variation in thickness between a top surface and a bottom surface thereof,
wherein at least one of the first lead frame or the second lead frame comprises roughness formed on a surface of a peripheral portion thereof, and
wherein a first protrusion and a first depression are formed at an edge of the first lead frame facing the second lead frame, and a second protrusion and a second depression are formed at an edge of the second lead frame facing the first frame lead frame.

7. The light emitting device package of claim 6, wherein a shape of the roughness is at least one of a curved shape, a triangular shape, a rectangular shape or a polygonal shape.

8. The light emitting device package of claim 6, wherein the first protrusion extends from the edge of the first lead frame toward the second lead frame, and the second protrusion extends from the edge of the second lead frame toward the first lead frame.

9. The light emitting device package of claim 6, wherein the first protrusion comprises one first protrusion formed at a lower edge portion of the first lead frame and another first protrusion formed at an upper edge portion of the first lead frame, and the second protrusion comprises one second protrusion formed at a lower edge portion of the second lead frame and another second protrusion formed at an upper edge portion of the second lead frame.

* * * * *